United States Patent
Sbiaa et al.

(10) Patent No.: US 7,606,008 B2
(45) Date of Patent: Oct. 20, 2009

(54) STABILIZER FOR MAGNETORESISTIVE HEAD AND METHOD OF MANUFACTURE

(75) Inventors: Rachid Sbiaa, Tokyo (JP); Haruyuki Morita, Tokyo (JP)

(73) Assignee: TDK Corporation, Tokyo (JP)

(*) Notice: Subject to any disclaimer, the term of this patent is extended or adjusted under 35 U.S.C. 154(b) by 773 days.

(21) Appl. No.: 10/572,038

(22) PCT Filed: Apr. 2, 2004

(86) PCT No.: PCT/JP2004/004832

§ 371 (c)(1),
(2), (4) Date: Mar. 15, 2006

(87) PCT Pub. No.: WO2005/101375

PCT Pub. Date: Oct. 27, 2005

(65) Prior Publication Data

US 2007/0035888 A1 Feb. 15, 2007

(51) Int. Cl.
*G11B 5/127* (2006.01)

(52) U.S. Cl. .................................. 360/324.11

(58) Field of Classification Search ............ 360/324.11, 360/324.12, 324.1, 324.2; 29/603.16, 603.14, 29/603.15
See application file for complete search history.

(56) References Cited

U.S. PATENT DOCUMENTS

| 5,729,410 A | 3/1998 | Fontana, Jr. |
| 6,421,212 B1 | 7/2002 | Barr et al. |
| 2002/0159201 A1 | 10/2002 | Li et al. |
| 2002/0167768 A1 | 11/2002 | Fontana, Jr. et al. |
| 2003/0174446 A1 | 9/2003 | Hasegawa |
| 2007/0035890 A1* | 2/2007 | Sbiaa ............. 360/324.11 |
| 2007/0064352 A1* | 3/2007 | Gill ............... 360/324.11 |
| 2007/0121255 A1* | 5/2007 | Tsuchiya et al. ...... 360/324.1 |
| 2007/0242391 A1* | 10/2007 | Yamaguchi et al. ...... 360/319 |
| 2008/0226948 A1* | 9/2008 | Mizuno et al. ......... 428/811.2 |

FOREIGN PATENT DOCUMENTS

| JP | 2002-305336 A | 10/2002 |
| JP | 2003-6821 A | 1/2003 |

OTHER PUBLICATIONS

Patent Abstracts of Japan vol. 1997, No. 04, Apr. 30, 1997 abstracting JP 8 329433 A (Sanyo Electric Co Ltd.) Dec. 13, 1996.
Munoz, M. et al., "Ballistic magnetoresistance in a nanocontact between a Ni cluster and a magnetic thin film", Applied Physics Letters, Oct. 2001, pp. 2946-2948, vol. 79, No. 18, American Institute of Physics.
Japanese Office Action dated Nov. 18, 2008.

* cited by examiner

*Primary Examiner*—Allen T Cao
(74) *Attorney, Agent, or Firm*—Sughrue Mion, PLLC

(57) ABSTRACT

A reader of a current-perpendicular-to-plane magnetoresistive head includes a spin valve with sensor having a stabilizer adjacent thereto, to substantially avoid magnetization distribution at the edge of the sensor due to vortex effect. At least one free layer is spaced apart from at least one pinned layer by a spacer. Above the free layer, a capping layer is provided. The stabilizer includes a pinned ferromagnetic layer adjacent to the free layer, and an antiferromagnetic layer positioned thereon. It becomes easy to provide an effective biasing using a variety of materials having different magnetic moments and thickness. Also problems related to sensor edge for small size will be overcome. A method of manufacturing the reader is also provided.

22 Claims, 17 Drawing Sheets

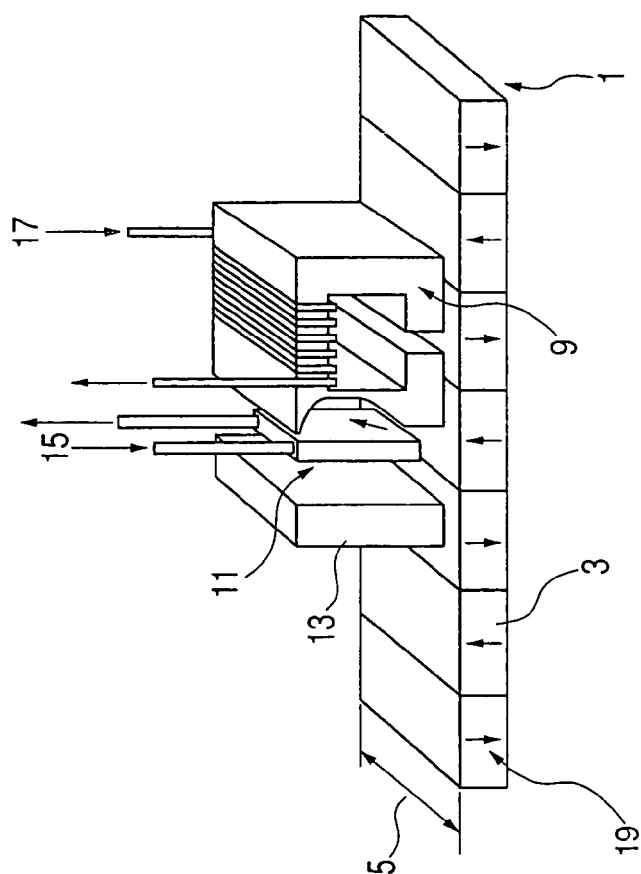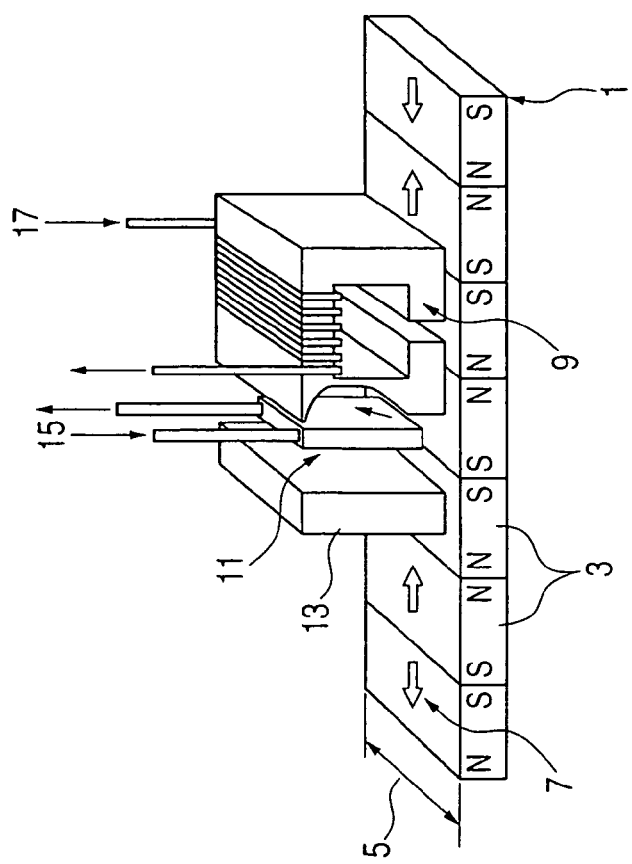

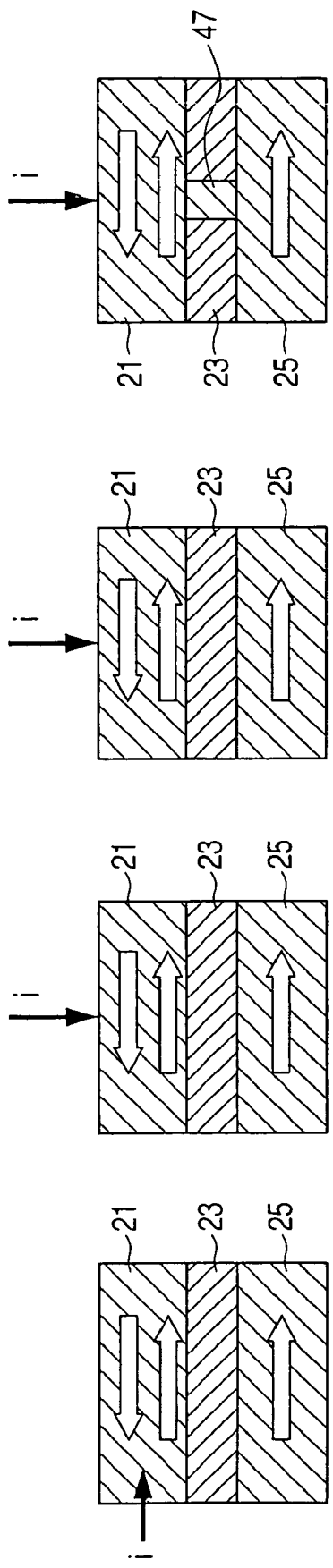

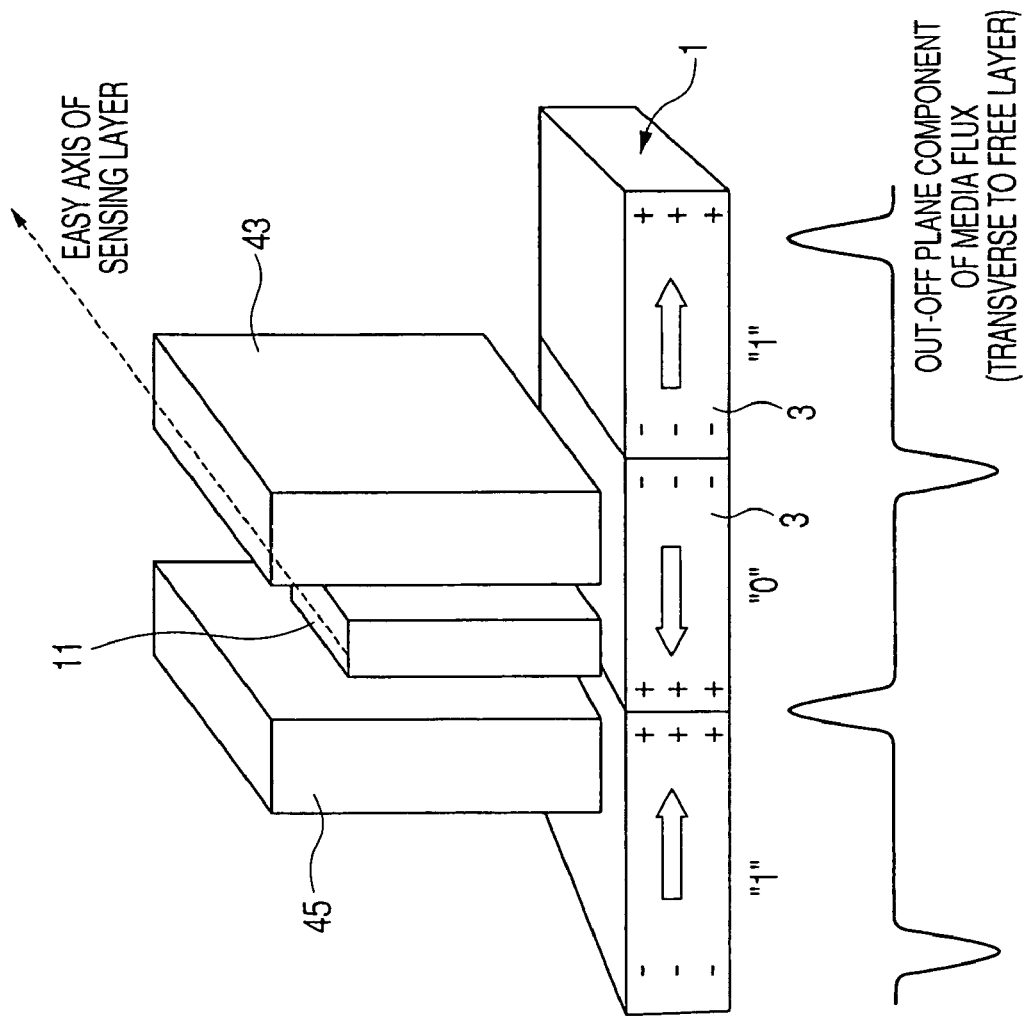

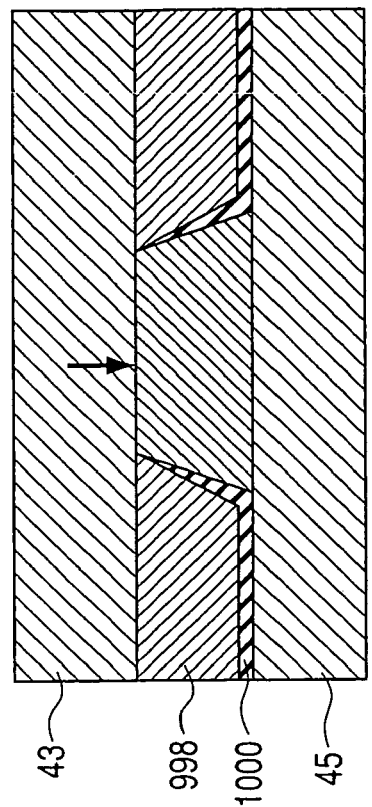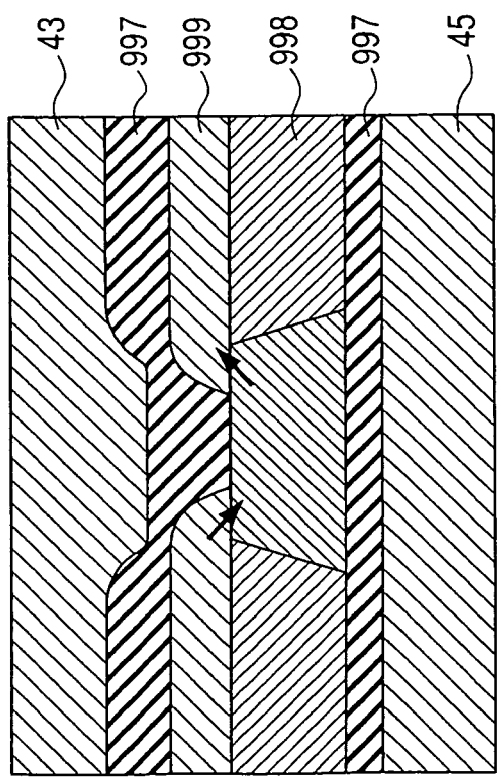

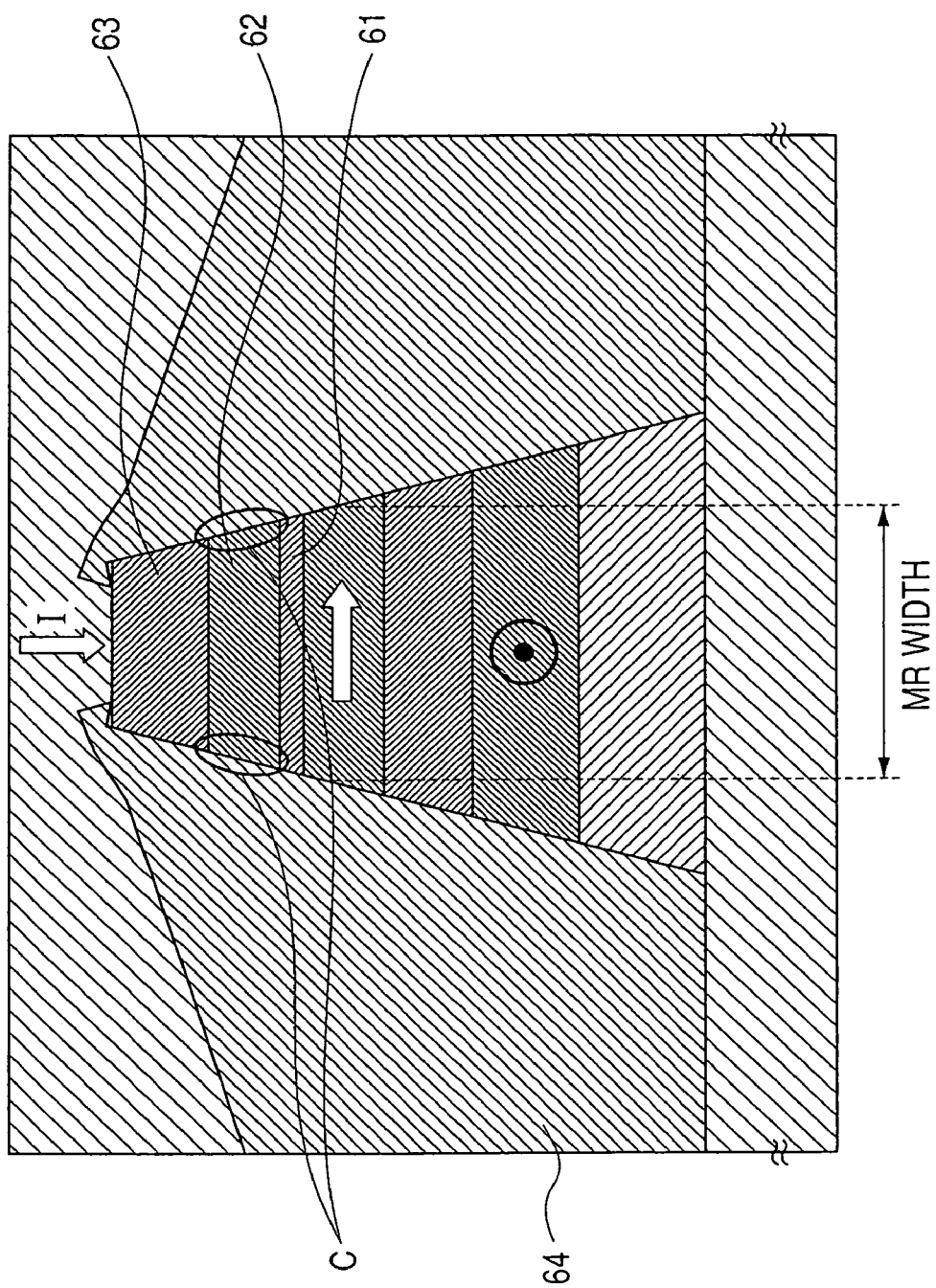

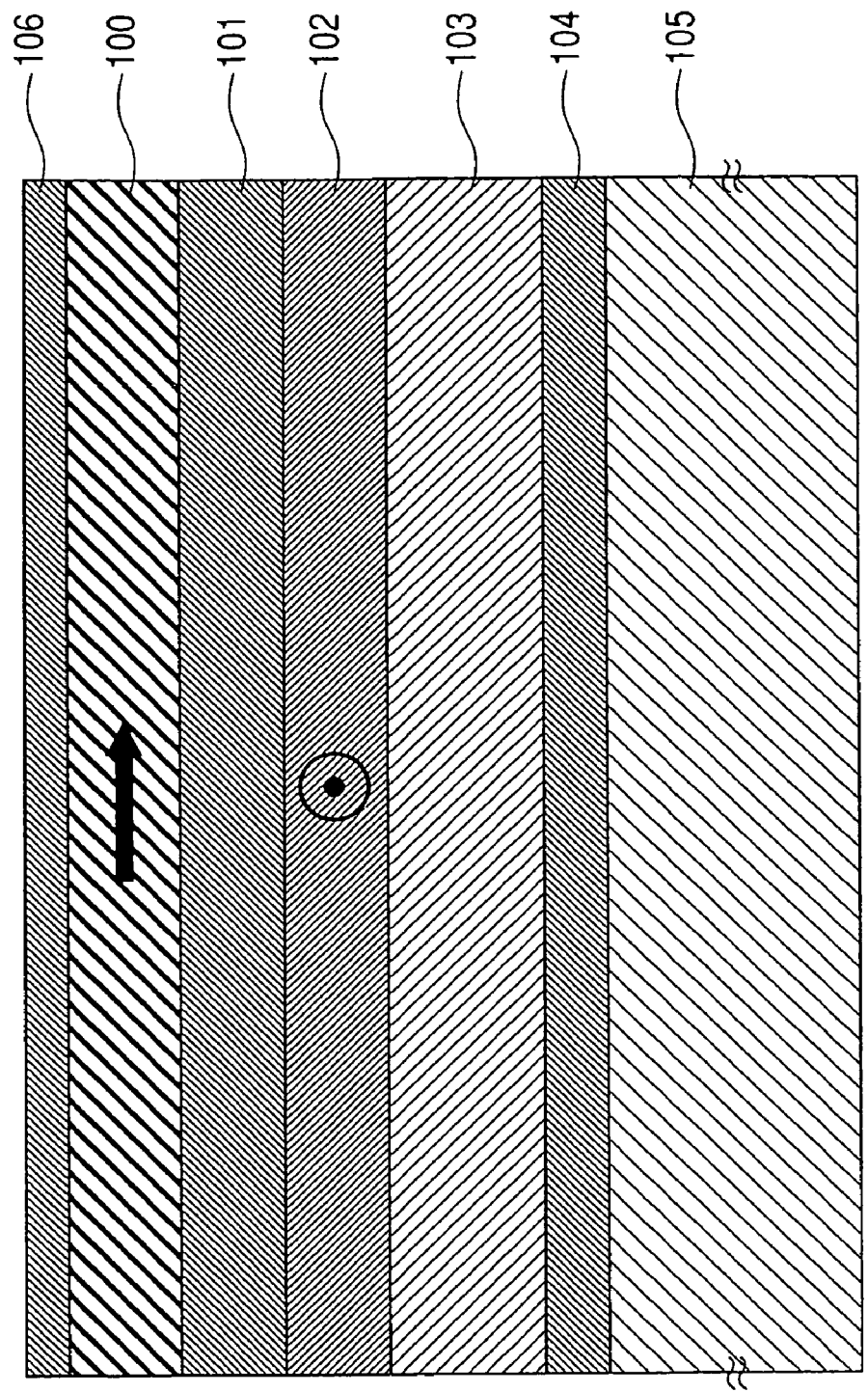

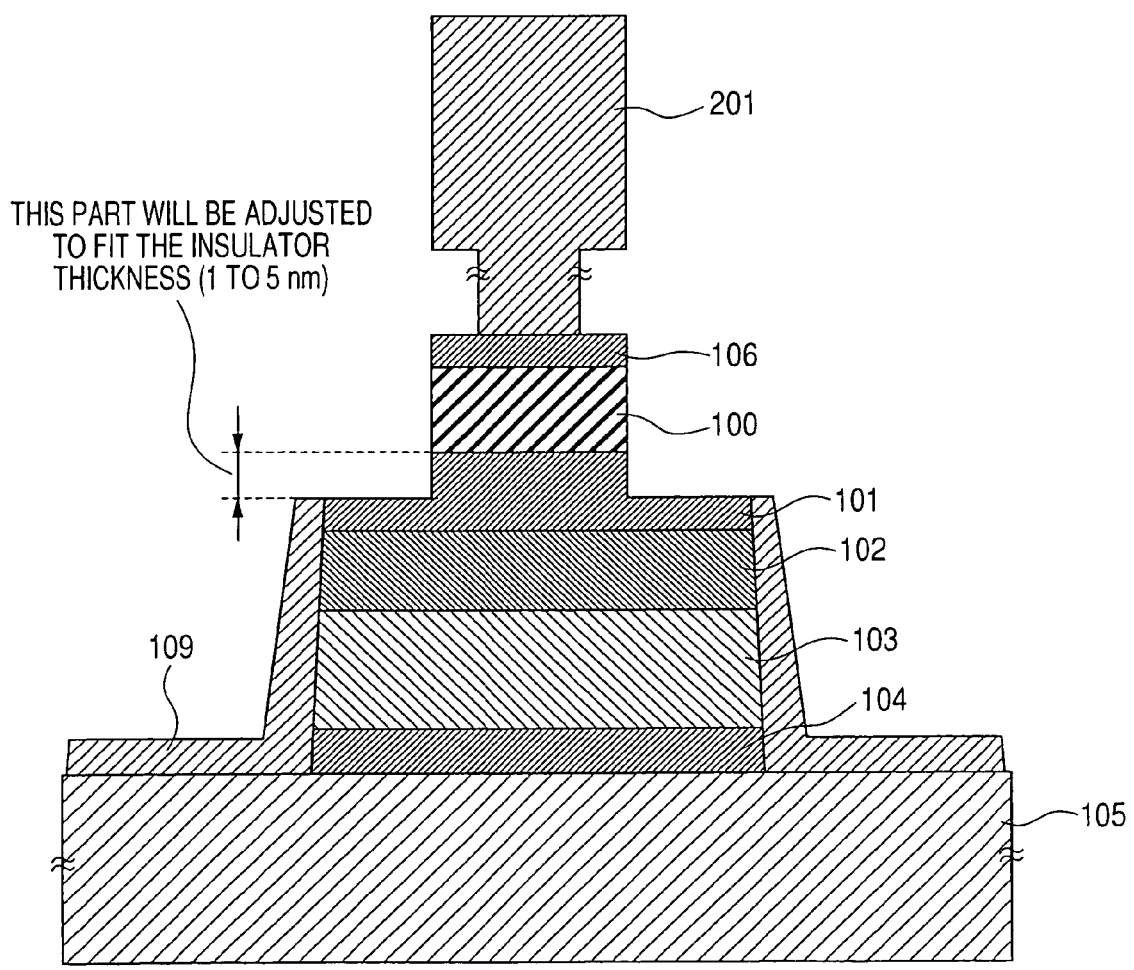

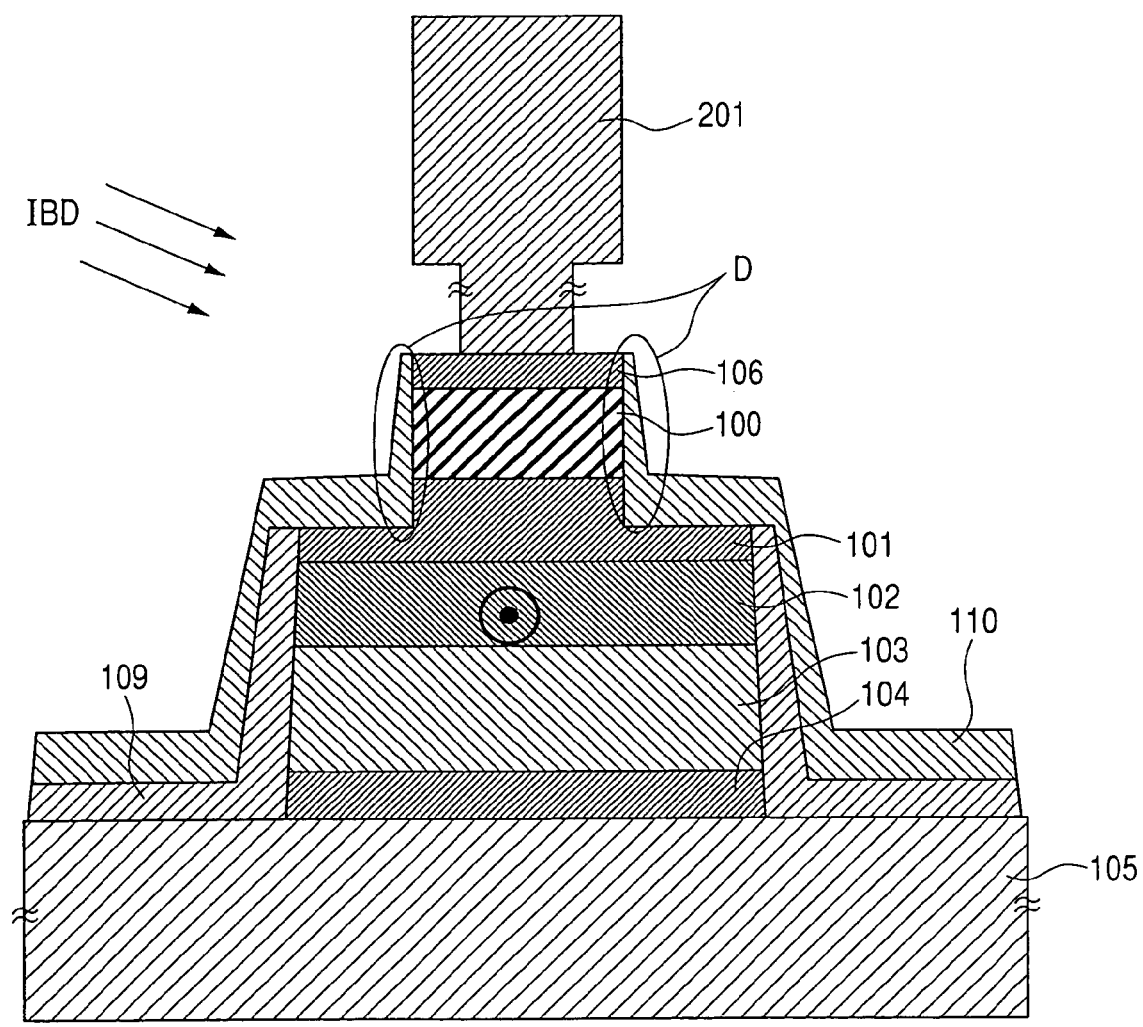

STABILIZER FOR MAGNETORESISTIVE HEAD AND METHOD OF MANUFACTURE

TECHNICAL FIELD

The present invention relates to a read element of a magnetoresistive (MR) head including a sensor having stabilizers on its sides, and a method of manufacture therefor. More specifically, the present invention relates to a spin valve of an MR read element having a pinned ferromagnetic layer next to the free layer.

BACKGROUND ART

In the related art magnetic recording technology such as hard disk drives, a head is equipped with a reader and a writer. The reader and writer have separate functions and operate independently of one another.

FIGS. 1 (a) and (b) illustrate related art magnetic recording schemes. In FIG. 1(a), a recording medium 1 having a plurality of bits 3 and a track width 5 has a magnetization parallel to the plane of the recording media. As a result, a magnetic flux is generated at the boundaries between the bits 3. This is also commonly referred to as "longitudinal magnetic recording media" (LMR).

Information is written to the recording medium 1 by an inductive write element 9, and data is read from the recording medium 1 by a read element 11. A write current 17 is supplied to the inductive write element 9, and a read current is supplied to the read element 11.

The read element 11 is a magnetic sensor that operates by sensing the resistance change as the sensor magnetization direction changes from one direction to another direction. A shield 13 reduces the undesirable magnetic fields coming from the media and prevents the undesired flux of adjacent bits from interfering with the one of the bits 3 currently being read by the read element 11.

The area density of the related art recording medium 1 has increased substantially over the past few years, and is expected to continue to increase substantially. Correspondingly, the bit and track densities are expected to increase. As a result, the related art reader must be able to read this data having increased density at a higher efficiency and speed.

In the related art, the density of bits has increased much faster than the track density. However, the aspect ratio between bit size and track size is decreasing. Currently, this factor is about 8, and is estimated to decrease to 6 or less as recording density approaches terabyte size.

As a result, the track width is becoming so small that the magnetic field from the adjacent tracks, and not just the adjacent bits, will affect the read sensor. Table 1 shows the estimated scaling parameters based on these changes.

TABLE 1

| Areal Density Gbpsi | bit density (Mbpi) | track density (ktpi) | bit aspect ratio (bit/track) | bit length nm | read track width nm | Track pitch nm |
|---|---|---|---|---|---|---|
| 200 | 1.2 | 160 | 7.5 | 20 | 100 | 150 |
| 400 | 1.8 | 222 | 8.1 | 14.1 | 76 | 110 |
| 600 | 2 | 300 | 6.7 | 12.7 | 55 | 85 |
| 1000 | 2.5 | 380 | 6.5 | 9.7 | 45 | ~? |

Another related art magnetic recording scheme has been developed as shown in FIG. 1(b). In this related art scheme, the direction of magnetization 19 of the recording medium 1 is perpendicular to the plane of the recording medium. This is also known as "perpendicular magnetic recording media" (PMR)

This PMR design provides more compact and stable recorded data. However, with PMR media the transverse field coming from the recording medium, in addition to the above-discussed effects of the neighboring media tracks, must also be considered. This effect is discussed below with respect to FIG. 6

The flux is highest at the center of the bit, decreases toward the ends of the bit and approaches zero at the ends of the bit. As a result, there is a strong transverse component to the recording medium field at the center of the bit, in contrast to the above-discussed LMR scheme, where the flux is highest at the edges of the bits.

FIGS. 2(a)-(c) illustrate various related art read sensors for the above-described magnetic recording scheme, also known as "spin valves". In the bottom type spin valve illustrated in FIG. 2(a), a free layer 21 operates as a sensor to read the recorded data from the recording medium 1. A spacer 23 is positioned between the free layer 21 and a pinned layer 25. On the other side of the pinned layer 25, there is an anti-ferromagnetic (AFM) layer 27.

In the top type spin valve illustrated in FIG. 2(b), the position of the layers is reversed. FIG. 2(c) illustrates a related art dual type spin valve. Layers 21 through 25 are substantially the same as described above with respect to FIGS. 2(a)-(b). An additional spacer 29 is provided on the other side of the free layer 21, upon which a second pinned layer 31 and a second AFM layer 33 are positioned. The dual type spin valve operates according to the same principle as described above with respect to FIGS. 2(a)-(b).

In the read head based on the MR spin valve, the magnetization of the pinned layer 25 is fixed by exchange coupling with the AFM layer 27. Only the magnetization of the free layer 21 can rotate according to the media field direction.

In the recording media 1, flux is generated based on polarity of adjacent bits. If two adjoining bits have negative polarity at their boundary the flux will be negative, and if those bits have positive polarity at the boundary the flux will be positive. The magnitude of flux determines the angle of magnetization between the free layer and the pinned layer.

When the magnetizations of the pinned and free layers are in substantially the same direction, then the resistance is low. On the other hand, when their magnetizations are in opposite directions the resistance is high. In the MR head application, when no external magnetic field is applied, the free layer 21 and pinned layer 25 have their magnetizations at 90 degrees with respect to each other.

When an external field (flux) is applied to a reader, the magnetization of the free layer 21 is altered, or rotated by an angle. When the flux is positive the magnetization or the free layer is rotated upward, and when the flux is negative the magnetization of the free layer is rotated downward. Further, when the applied external field results in the free layer 21 and the pinned layer 25 having the same magnetization direction, then the resistance between the layers is low, and electrons can more easily migrate between those layers 21, 25.

However, when the free layer 21 has a magnetization direction opposite to that of the pinned layer 25, the resistance between the layers is high. This increased resistance occurs because it is more difficult for electrons to migrate between the layers 21, 25.

Similar to the external field, the AFM layer 27 provides an exchange coupling field and keeps the magnetization of pinned layer 25 fixed. In the related art, the AFM layer 27 is usually PtMn or IrMn.

The resistance change ΔR between the states when the magnetizations of layers 21, 25 are parallel and anti-parallel should be high to have a highly sensitive reader. As head size decreases, the sensitivity of the reader becomes increasingly important, especially when the magnitude of the media flux is decreased. Thus, there is a need for high resistance change ΔR between the layers 21, 25 of the related art spin valve.

FIG. 6 graphically shows the foregoing principle for the related art longitudinal magnetic recording scheme illustrated in FIG. 1(a). As the media spins, the flux at the boundary between bits acts on the free layer such that magnetization rotates upward and downward according to the related art spin valve principles.

The flux generated by the recording media results in a change in the magnetization direction of the free layer. As a result, an angle between the directions of magnetization of the free layer and the pinned layer is generated. The output signal of the reader is a function of the cosine of this angle. To increase the output signal, it is desirable to have a free layer that has a single magnetic domain. Such a configuration can cancel noise, more specifically known as Barkhausen noise that originates in non-oriented domains of the free layer.

U.S. Patent publication nos. 2002/0167768 and 2003/0174446, the contents of which are incorporated herein by reference, disclose side shields to avoid flux generated by adjacent tracks, along with an in-stack bias. This in-stack bias, or alternatively, a hard bias can reduce the effect of the above-described non-oriented domains. These related art bias and/or stabilizing schemes are discussed in greater detail below.

As shield-to-shield spacing declines below about 40 nm, it is difficult to avoid current leakage from the shield to the MR element. Further, as the head size decreases the field induced by sensing current will generate a vortex at the free layer.

FIGS. 8(a) and 8(b) illustrate the related art hard bias stabilizer and in-stack bias stabilizer, respectively. As shown in FIG. 8(a), the hard bias stabilizer includes an insulator 50 positioned on the bottom shield and the read sensor elements, a buffer 51 mounted on the insulator 50, and a hard bias layer 52 mounted on the buffer 51. In the related art, the hard bias layer 52 is made of CoCrPt.

In the related art hard bias, the buffer 51 must be thick in order to obtain a sufficiently large coercivity (e.g., greater than about 1000 Oe). More specifically, the buffer may include at least two or three different kinds of films, such that the total thickness of the buffer and insulator is 10 nm. The hard bias layer 52 and the buffer 51 are thick in the related art.

As a result of these layers 50, 51, the hard bias layer 52 is away from the free layer edge, which results in reduced stability due to the reduced hard bias field strength. Further, because the sides of the hard bias layer 52 grow in an oblique manner, the magnetic field induced by the hard bias will have not have the same easy direction as the easy axis of the free layer. This deviation between the free layer easy axis and the easy axis of the hard bias results in a less efficient hard bias. Further, due to its larger thickness, performance of the buffer is better at region A.

Additionally, because the hard bias layer 52 is made of CoPtX, where X is Cr and Ta, it is necessary to have a thicker hard bias layer to obtain the required coercivity. For example, a CoPtCr layer has a thickness of about 100 nm, in additional to the thick buffer layer required in this related art device.

Due to the oblique growth and its thinner buffer, coercivity is lower and performance is reduced at region B. Also, in the related art stabilizer, noise is generated (i.e., a vortex effect) in the free layer due to magnetic fields generated by sense current.

Accordingly, there is an unmet need in the related art to overcome the foregoing related art problems. For example, but not by way of limitation, there is an unmet need to reduce thickness of the stabilizer including the buffer layer 51. However, this cannot be done with the presently used materials due to the coercivity requirements of the MR sensor.

FIG. 8(b) illustrates a related art in-stack bias. In addition to the above-disclosed related art elements in FIGS. 1-7, a non-magnetic decoupler 61 is provided above the free layer, and a ferromagnetic stabilizer 62 is provided on the decoupler 61. Further, a second AFM layer 63 is provided on the stabilizer 62. The in-stack bias and sensor layers have an insulator 64 on their sides.

However, the foregoing related art in-stack bias has various problems and disadvantages. For example, but not by way of limitation, because the width of the free layer of the sensor exceeds the width of the in-stack bias elements 61-63, regions C of the structure are not well pinned. Thus, stability is reduced in at least those areas.

Because the in-stack bias is substantially smaller than the free layer located below, the magnetic domain at the edge of the free layer is not completely aligned with the easy axis.

Accordingly, the related art bias has various problems and disadvantages. For example, but not by way of limitation, when the free layer has a width of less than 100 nm, the magnetic moments are randomly distributed at the edge, which is a source of noise in region C. The free layer region below the noise source region C is not stabilized. Thus, undesired magnetic fluctuation is generated.

As the width of the free layer 21 decreases, the demagnetizing field increases. For example, the magnetization of the free layer may begin to switch at the edge of the free layer and extend toward the center of the free layer. Further fluctuations of magnetization accelerate this switching process.

Additionally, ion milling can damage the free layer edge. Further, the in-stack bias that uses the anti-ferromagnetic (AFM) layer 63 to pin the stabilizer layer is shorter than the stabilizer layer. As a result, the stabilizer layer is not fully pinned, and cannot provide the maximum stability.

As a result of the foregoing related art problems, there is a need to shield the bit from the flux generated at adjacent tracks as well as adjacent bits within a track.

In addition to the foregoing related art spin valve in which the pinned layer is a single layer, FIG. 3 illustrates a related art synthetic spin valve. The free layer 21, the spacer 23 and the AFM layer 27 are substantially the same as described above. In FIG. 3 only one state of the free layer is illustrated. However, the pinned layer further includes a first sublayer 35 separated from a second sublayer 37 by a spacer 39.

In the related art synthetic spin valve, the first sublayer 35 operates according to the above-described principle with respect to the pinned layer 25. Additionally, the second sublayer 37 has an opposite spin state with respect to the first sublayer 35. As a result, the pinned layer total moment is reduced due to anti-ferromagnetic coupling between the first sublayer 35 and the second sublayer 37. A synthetic spin-valve head has a pinned layer with a total flux close to zero, high resistance change ΔR and greater stability.

FIG. 4 illustrates the related art synthetic spin valve with a shielding structure. As noted above, it is important to avoid unintended magnetic flux from adjacent bits from being sensed during the reading of a given bit. A top shield 43 is provided on an upper surface of the free layer 21. Similarly, a bottom shield 45 is provided on a lower surface of the AFM layer 27. The effect of the shield system is shown in and discussed with respect to FIG. 6.

As shown in FIGS. 5(a)-(d), there are four related art types of spin valves. The type of spin valve structurally varies based on the structure of the spacer 23.

The related art spin valve illustrated in FIG. 5(a) uses the spacer 23 as a conductor, and is used for the related art CIP scheme illustrated in FIG. 1(a) for a giant magnetoresistance (GMR) type spin valve where the current is in-plane-to the film.

In the related art GMR spin valve, resistance is minimized when the magnetization directions (or spin states) of the free layer 21 and the pinned layer 25 are parallel, and is maximized when the magnetization directions are opposite. As noted above, the free layer 21 has a magnetization direction that can be changed. Thus, perturbation of the head output signal can be avoided by minimizing the undesired change of the pinned layer magnetization direction.

The MR ratio depends on the degree of spin polarization of the pinned and free layers, and the angle between their magnetizations. Spin polarization depends on the difference between the number of electrons in spin state up and down normalized by the total number of the conduction electrons in each of the free and pinned layers.

As the free layer 21 receives the flux that signifies bit transition, the free layer magnetization rotates by a small angle in one direction or the other, depending on the direction of flux. The change in resistance between the pinned layer 25 and the free layer 21 is proportional to angle between the magnetizations of the free layer 21 and the pinned layer 25.

The GMR spin valve has various requirements. For example, but not by way of limitation, a large resistance change ΔR is required to generate a high output signal. Further, low coercivity is desired, so that small media fields can also be detected. With high pinning field strength, the pinned layer magnetization direction is fixed against external magnetic field, and when the interlayer coupling is low, the sensing layer (free layer) is not affected by the pinned layer. Further, low magnetistriction is desired to minimize stress on the free layer.

In order to increase the recording density, the track width of the GMR sensor must be made smaller. In this aspect read head operating in CIP scheme (current-in-plane), various issues arise as the size of the sensor decreases. The magnetoresistance (MR) in CIP mode is generally limited to about 20%. When the electrode connected to the sensor is reduced in size overheating results and may potentially damage the sensor, as can be seen from FIG. 7(a). Further, the signal available from CIP sensor is proportional to the MR head width.

To address the foregoing issues and as shown in FIG. 7(b), related art CPP-GMR scheme uses a sense current that flows in a direction perpendicular to the spin valve plane. As a result, size can be reduced. Various related art spin valves that operate in the CPP scheme are illustrated in FIGS. 5(b)-(d), and are discussed in greater detail below.

FIG. 5(b) illustrates a related art tunneling magnetoresistive (TMR) spin valve for a CPP scheme. In the TMR spin valve, the spacer 23 acts as an insulator, or tunnel barrier layer. Thus, electrons can tunnel from free layer to pinned layer through the insulator barrier 23. TMR spin valves have an increased MR on the order of about 30-50%.

FIG. 5(c) illustrates a related art CPP-GMR spin valve. While the general concept of GMR is similar to that described above with respect to CIP-GMR, the current flows perpendicular to the plane, instead of in-plane. As a result, the resistance change DR and the intrinsic MR are substantially higher than the CIP-GMR.

In the related art CPP-GMR spin valve, there is a need for a large ΔR*A (A is the area of the MR element) and a moderate head resistance. A low free layer coercivity is required so that a small media field can be detected. The pinning field should also have a high strength.

FIGS. 7(a)-(b) illustrate the structural difference between the CIP and CPP GMR spin valves. As shown in FIG. 7(a), there is a hard bias 998 on the sides of the GMR spin valve, with an electrode 999 on upper surfaces of the GMR. Gaps 997 are also required. As shown in FIG. 7(b), in the CPP-GMR spin valve, an insulator 1000 is deposited at the side of the spin valve that the sensing current can only flow in the film thickness direction. Further, no gap is needed in the CPP-GMR spin valve.

As a result, the sense current has a much larger surface through which to flow, and thus, the overheating issue is substantially solved.

FIG. 5(d) illustrates the related art ballistic magnetoresistance (BMR) spin valve. In the spacer 23, which operates as an insulator, a ferromagnetic layer region 47 connects the pinned layer 25 to the free layer 21. The area of contact is on the order of few nanometers. As a result, there is a substantially higher MR due to electrons scattering at the domain wall created within this nanocontact. Other factors include the spin polarization of the ferromagnets, and the structure of the domain that is in nano-contact with the BMR spin valve.

However, the related art BMR spin valve is in early development. Further, for the BMR spin valve the nano-contact shape and size controllability and stability of the domain wall must be further developed. Additionally, the repeatability of the BMR technology is yet to be shown for high reliability.

In the foregoing related art spin valves of FIGS. 5(a)-(d), the spacer 23 of the spin valve is an insulator for TMR, a conductor for GMR, and an insulator having a magnetic nano-sized connector for BMR. While related art TMR spacers are generally made of more insulating materials such as alumina, related art GMR spacers are generally made of more conductive metals, such as copper.

Accordingly, there is a need to address at least the foregoing issues of the related art.

DISCLOSURE OF INVENTION

It is an object of the present invention to overcome at least the aforementioned problems and disadvantages of the related art.

To achieve at least this object and other objects, a device for reading a recording medium and having a spin valve is provided, comprising a magnetic sensor that includes a free layer having an adjustable magnetization in response to a magnetic flux, and a pinned layer having a fixed magnetization by a first antiferromagnetic (AFM) layer positioned on a surface of the pinned layer opposite to a spacer sandwiched between the pinned layer and the free layer. The magnetic sensor also includes a buffer sandwiched between the first AFM layer and a bottom shield that shields undesired flux at a lower surface of the magnetic sensor, and a capping layer sandwiched between the free layer and a top shield that shields undesired flux at an upper surface of the magnetic sensor. Further, a stabilizer is positioned adjacent to the magnetic sensor and separated from the magnetic sensor by an insulator layer, the stabilizer comprising a pinned ferromagnetic stabilizer positioned on the insulator layer adjacent to the free layer and pinned by a second AFM layer sandwiched between the pinned ferromagnetic stabilizer and an upper insulator upon which the shield is positioned.

Also, a method of fabricating a magnetic sensor is provided, comprising the steps of forming a free layer having an adjustable magnetization direction in response to an external field, a pinned layer having a fixed magnetization direction by exchange coupling with a first antiferromagnetic (AFM) layer positioned on a surface of the pinned layer opposite a spacer sandwiched between the pinned layer and the free layer, a buffer sandwiched between the AFM layer and a bottom shield that shields undesired flux at a first outer surface of the magnetic sensor, and a capping layer on the free layer, and forming a mask on a first region on the capping layer. Additionally, the method includes performing a first ion milling step to generate a sensor region and depositing a first insulator sublayer thereon, modifying the a mask to cover a second region smaller than the first region on the capping layer, and performing a second ion milling step to generate a shape of the magnetic sensor by removing parts of the capping layer, the free layer and a first portion of the spacer that are outside of the second region. Further, the method includes depositing a stabilizer having a second insulator sublayer, a pinned ferromagnetic stabilizer layer, a second AFM layer and an upper insulator, and then removing the second mask, and forming a top shield on the capping layer and the upper insulator.

BRIEF DESCRIPTION OF DRAWINGS

The above and other objects and advantages of the present invention will become more apparent by describing in detail preferred exemplary embodiments thereof with reference to the accompanying drawings, wherein like reference numerals designate like or corresponding parts throughout the several views, and wherein:

FIGS. 1(a) and (b) illustrates a related art magnetic recording scheme having in-plane and perpendicular-to-plane magnetization, respectively;

FIGS. 5(a)-(d) illustrates various related art magnetic reader spin valve systems;

FIG. 6 illustrates the operation of a related art GMR sensor system;

FIGS. 7(a)-(b) illustrate related art CIP and CPP GMR systems, respectively; and FIGS. 8(a)-(b) illustrate a related art hard bias and in-stack bias stabilizers;

FIGS. 10(a)-(g) illustrate a method for manufacturing a spin valve according to an exemplary, non-limiting embodiment of the present invention.

MODES FOR CARRYING OUT THE INVENTION

Referring now to the accompanying drawings, description will be given of preferred embodiments of the invention. Substantially similar elements of subsequent embodiments will not be repeated where those elements were already discussed with respect to a previous embodiment.

The present invention relates to a magnetoresistive sensor design for a reading head. The stabilizer of the reading head has a substantially small distance between the free layer and the stabilizer, as well as the high pinning field. Further, the sensing current substantially does not flow through the stabilizer.

Figure 9:
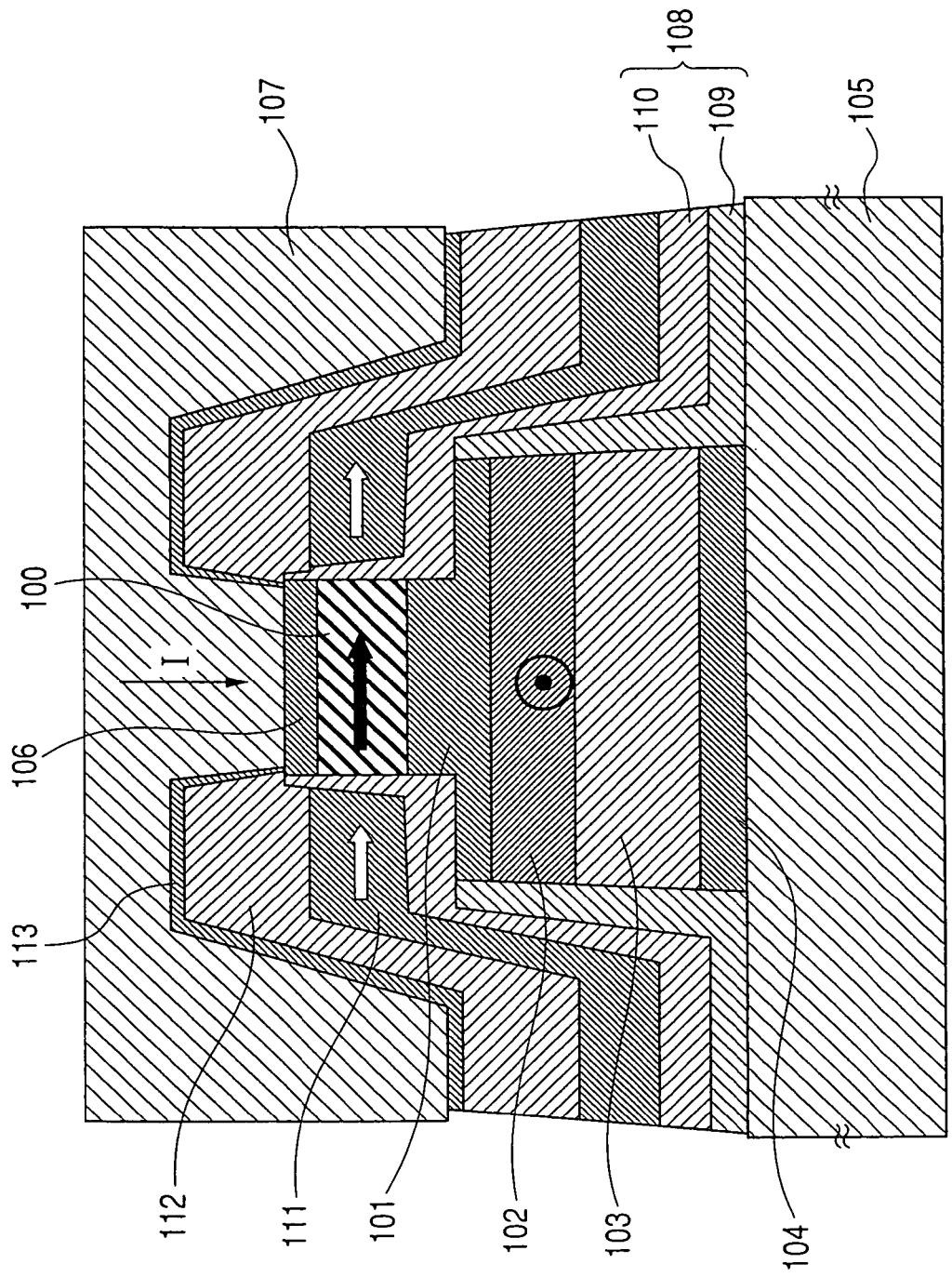
FIG. 9 illustrates a spin valve according to an exemplary, non-limiting embodiment of the present invention.

FIG. 9 illustrates a spin valve of a sensor for reading a magnetic medium according to an exemplary, non-limiting embodiment of the present invention. A spacer 101 is positioned between a free layer 100 and a pinned layer 102. As discussed above with respect to the related art, an external field is applied to the free layer 100 by a recording medium, such that the magnetization direction of the free layer 100 can be changed. The pinned layer 102 has a fixed magnetization direction.

The pinned layer 102 can be a single or synthetic pinned layer, and has a thickness of about 2 nm to about 10 nm. The free layer 100 is made from a material having at least one of Co, Fe and Ni. Alternatively or in combination with the foregoing materials, the free layer 100 and/or the pinned layer 102 may be made of a partially metal material that includes, but is not limited to, $Fe_3O_4$, $CrO_2$, NiFeSb, NiMnSb, PtMnSb, MnSb, $La_{0.7}Sr_{0.3}MnO_3$, $Sr_2FeMoO_6$ and $SrTiO_3$. The free layer 100 has a thickness of about 1 nm to about 3 nm, and is less than about 100 nm wide.

A first anti-ferromagnetic (AFM) layer 103 is positioned on a lower surface of the pinned layer 102, and a buffer 104 is positioned on a lower surface of the AFM layer 103. A bottom shield 105 is provided below the buffer 104. Above the free layer 100, a capping layer 106 is provided for protection of the spin valve against oxidation, with a top shield 107 thereon.

The stabilizer of this exemplary, non-limiting embodiment of the present invention will now be described in greater detail. An insulator 108 is placed on the sides of the sensor and an upper surface of the bottom shield 105. A first insulator sublayer 109 covers the bottom shield 105 and the sides of the sensor from the buffer 104 to a part of the spacer 101.

A second insulator sublayer 110 covers the first insulator sublayer 109, and covers the rest of the spacer 101 as well as the sides of the free layer 100 and the capping layer 106. The portion of the spacer 100 covered by the second insulator sublayer 110 but not the first insulator sublayer 109 is about 1 nm to about 5 nm in thickness. The insulator 108 substantially avoids current leakage between the sensor and the stabilizer.

Above the insulator 108, a ferromagnetic layer 111 is positioned that includes a pinned portion substantially adjacent to the free layer 100. More specifically, the ferromagnetic layer 111 is separated from the free layer 100 only by the second insulator sublayer 110. A second AFM layer 112 is provided above the ferromagnetic layer 111, and an upper insulator 113 is provided above the second AFM layer 112. The thickness of the upper insulator 113 is sufficient to insulate the second AFM layer 112 and the ferromagnetic layer 111, such that current flows only through the sensor, and not into the stabilizer.

The ferromagnetic layer 111 is pinned at the side of the free layer 100 such that the free layer 100 can be made monodomain. Further, the sensing current I is substantially prevented from flowing through the stabilizer structure. Additionally, the stabilizer is easily pinned at elevated temperatures by the external field in the free layer direction.

In the foregoing exemplary, non-limiting embodiment of the present invention, the ferromagnetic layer 111 is a ferromagnetic film with an adjustable magnetic moment. For example, but not by way of limitation, $Fe_xCo_{1-x}$ (where x is about 40 percent to about 60 percent) may be used. More specifically, $Fe_{50}CO_{50}$ is used in an exemplary, non-limiting embodiment of the present invention. The ferromagnetic layer 111 has a thickness substantially the same as the free layer or for example, about 3 nm.

Further, the pinned ferromagnetic stabilizer has a thickness that is substantially the same as a thickness of the free layer within an approximate 20% margin.

The second AFM layer 112 is an antiferromagnetic pinning layer, and may be made of materials such as IrMn, PtMn, PtPdMn, or the like. However, the present invention is not limited to the foregoing materials, and other materials as would be recognized as equivalents by one skilled in the art may be substituted therefor.

While the MR sensor as described above has a single pinned layer, the present invention is not limited thereto. For example, but not by way of limitation, the pinned layer of the MR sensor may also be a synthetic type pinned layer described above, including antiferromagnetically coupled bilayers.

In the present invention, the sense current flows in the direction perpendicular to the film plane, i.e., in the film thickness direction. As a result, the spacer 101 is conductive when the spin valve is used in CPP-GMR applications. Alternatively, for TMR applications, the spacer 101 is insulative (for example but not by way of limitation, TaO, AlN and/or $Al_2O_3$). When a connection between the free and pinned layer is provided as discussed above with respect to the related art, a BMR-type head may be provided, where nanocontact connections of less than about 30 nm is provided in an insulator matrix.

Additionally, while only top and bottom shields 105, 107 are shown, additional leads may be provided for conducting the sense current. However, such shields are not necessary and are only optional, because the shields themselves can also be used as electrodes.

An exemplary, non-limiting method of manufacturing the foregoing structure of the present invention will now be described, as illustrated by FIGS. 10(a)-(g), each of which shows a cross-sectional view for various steps of manufacture.

FIG. 10(a) illustrates apart of the spin layer according to the present invention. The sensor element is formed by deposition of the bottom shield 105, the buffer layer 104, the AFM layer 103, the pinned layer 102, the spacer 101, the free layer 100, and the capping layer 106, which is a protective layer.

The pinned layer 102 can be formed as a single layer or two antiferromagnetically coupled bi-layers, which is discussed above in greater detail. The spacer 101 can be made of a conductive material including (but not limited to) Cu, Ag, Cr or the like. Alternatively, when an insulative spacer is needed, as in the case of TMR described above, a material such as $Al_2O_3$, AlN, MgO or the like may be used.

Figure 10B:
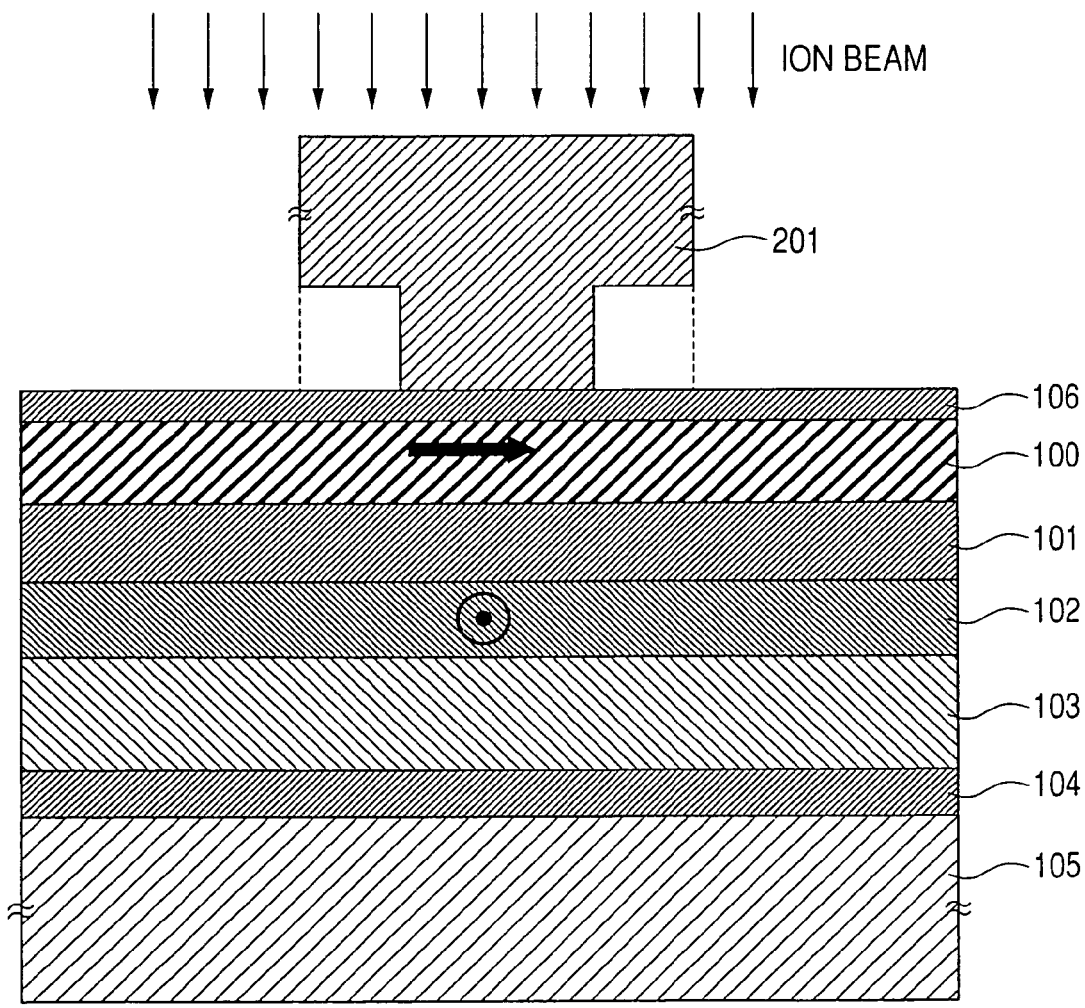

As shown in FIG. 10(b), the capping layer 106 is covered by a photoresist layer 201 and subjected to electron beam exposure and development to form the resist mask in the desired form. The resist is substantially larger than width of the MR sensor. The substrate subjected to ion milling (also referred to as ion etching) such that the area not covered by the resist is etched.

Figure 10C:
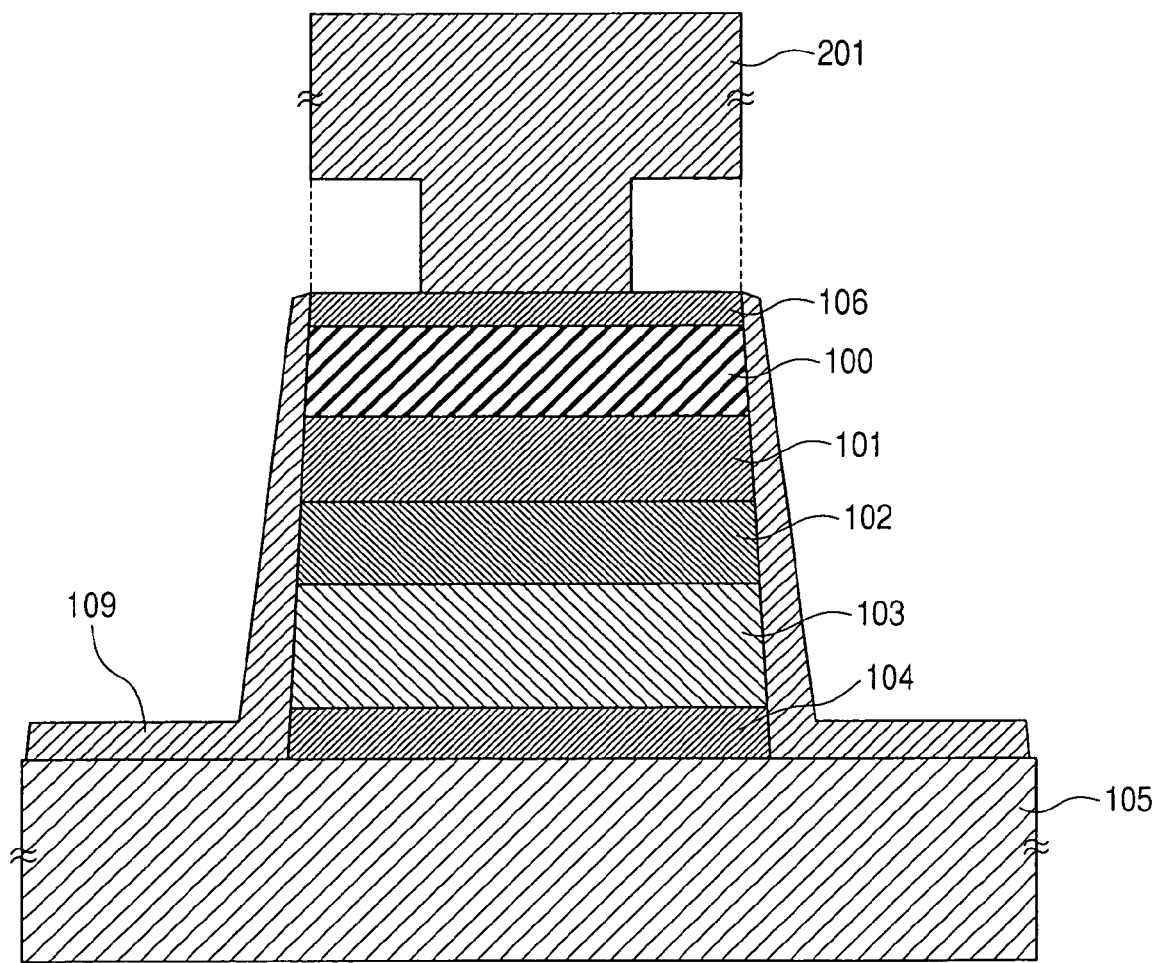

An insulator that includes the first insulator sublayer is then deposited by ion beam deposition (IBD) as shown in FIG. 10(c). While this step is performed by IBD, any equivalent procedure to produce the structure shown in FIG. 10(c) may be used.

Figure 10D:
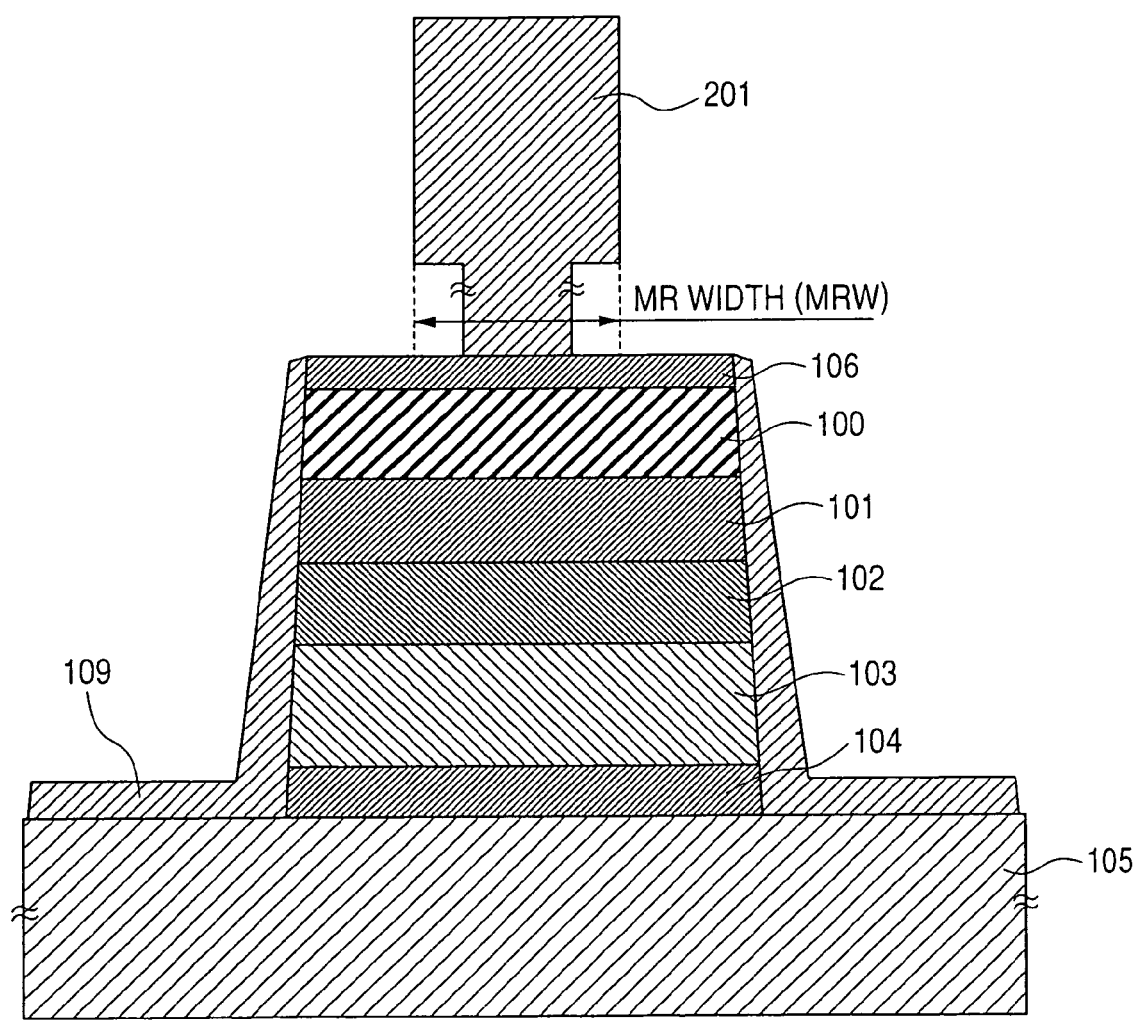

Then, as shown in FIG. 10(d), the resist 201 is formed to have a width that substantially equals the width of the MR sensor. The resist size and/or shape is modified by those techniques that are well-known in the art. For example, this step may be accomplished by removing chemically the first mark 201 (lift-off process) and re-deposition of another resist mask in the same manner as described before.

FIG. 10(e) shows the next step, which involves removing portions of the substrate not covered by the resist, to form the sensor having the desired width of the reader element. In this step, the capping layer 106 and free layer 100 regions that are outside of the resist 201 are completely removed, and a portion of the spacer 101 region outside of the resist 201 is removed. Depending on the desired thickness the second insulator 110, the etching can be conducted until pinned layer. The thickness of the portion of the spacer 101 that is removed is about 1 nm to about 5 nm, and substantially depends on the thickness of the second insulator sublayer 110.

Once the removal of the step shown in FIG. 10(e) has been completed, a second IBD step is performed as shown in FIG. 10(f). In this step, IBD is used to deposit the second insulator sublayer 110. As noted above, this sublayer 110 is designed to substantially reduce current leakage into the stabilizer.

The second insulator sublayer 10 covers the first insulator sublayer 109 as well as the removed portions of the spacer 101 or eventually the pinned layer 102, the free layer 100 and the capping layer 106. In this step, the deposition angle may be tilted in order to produce superior insulation at the edge of the free layer 100. Further, because the milled thickness is small (on the order of less than about 3 nm), region D of the second insulator sublayer 110 can be relatively straight, or vertical.

Figure 10G:
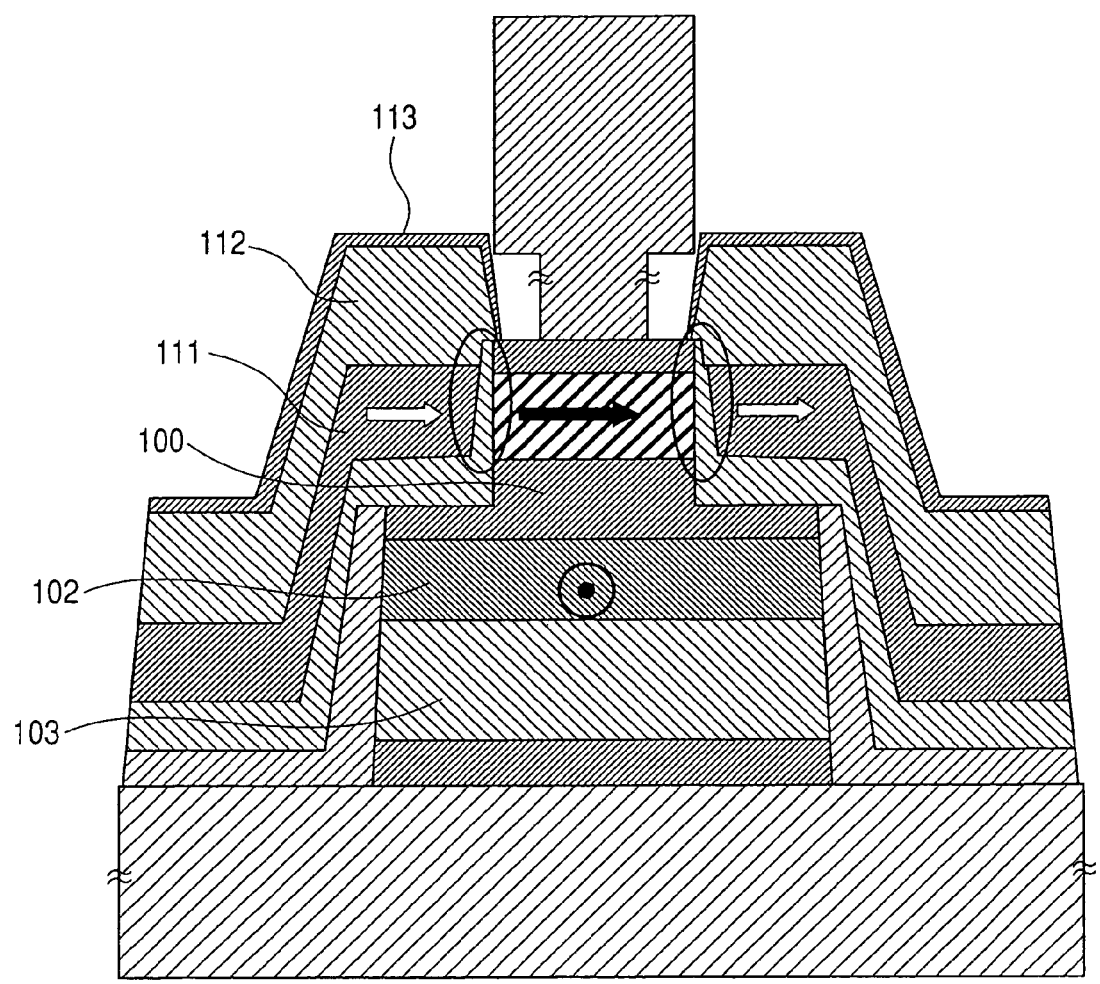

As shown in FIG. 10(g), the formation of the device is completed by deposition of the ferromagnetic layer 111, the second AFM layer 112 and the insulator 113. This deposition can be formed by a well-known method, including but not limited to IBD. After this step, the resist is removed and the top shield is deposited upon the resulting structure.

The present invention has various advantages. For example, but not by way of limitation, the related art edge effect of the in-stack bias is no longer present. As sensor size decreases, the processing at the edge as opposed to the surface becomes increasingly important. Therefore, the related art edge effect problems of the in-stack bias are corrected, and device size can be further decreased without having those edge effect problems.

For the CPP embodiments of the present invention, the in-stack bias problem of increased resistance due to the current flowing through the in-stack bias is also substantially eliminated. As a result, the resistance is reduced and correspondingly, the MR ratio is increased.

Further, the ferromagnetic layer 111 is very close to the free layer 100. As a result, noise is substantially reduced and the overall stability is improved.

Figure 2A:
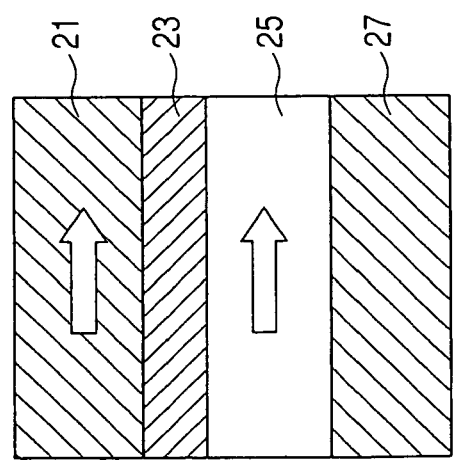
FIGS. 2(a)-(c) illustrate related art bottom, top and dual type spin valves.
Figure 2B:
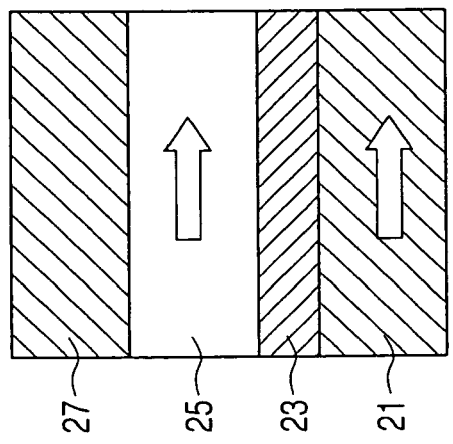
Figure 2C:
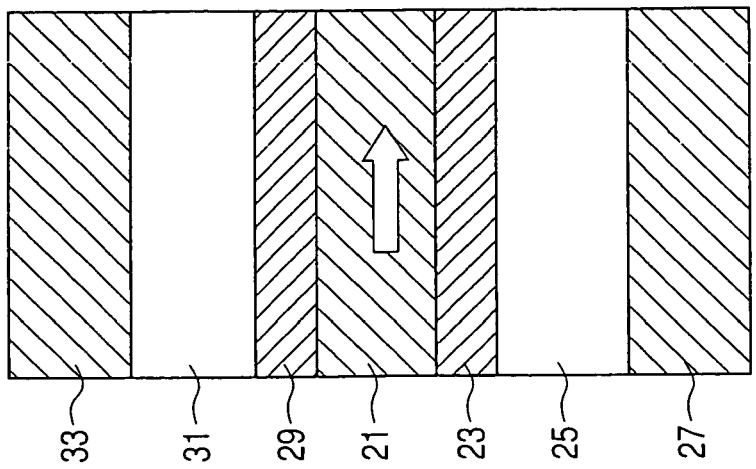
Figure 3:
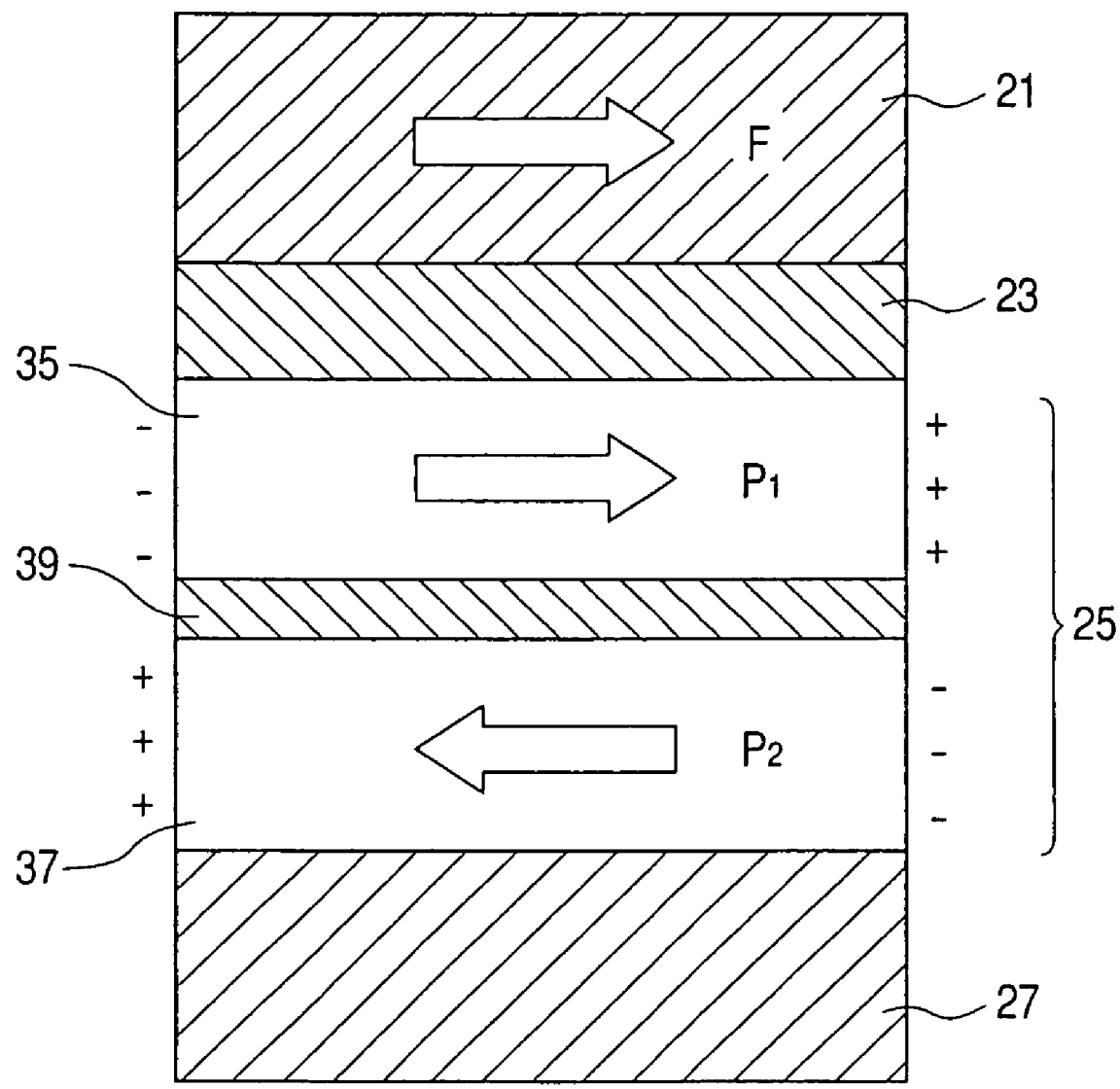
FIG. 3 illustrates a related art synthetic spin valve.
Figure 4:
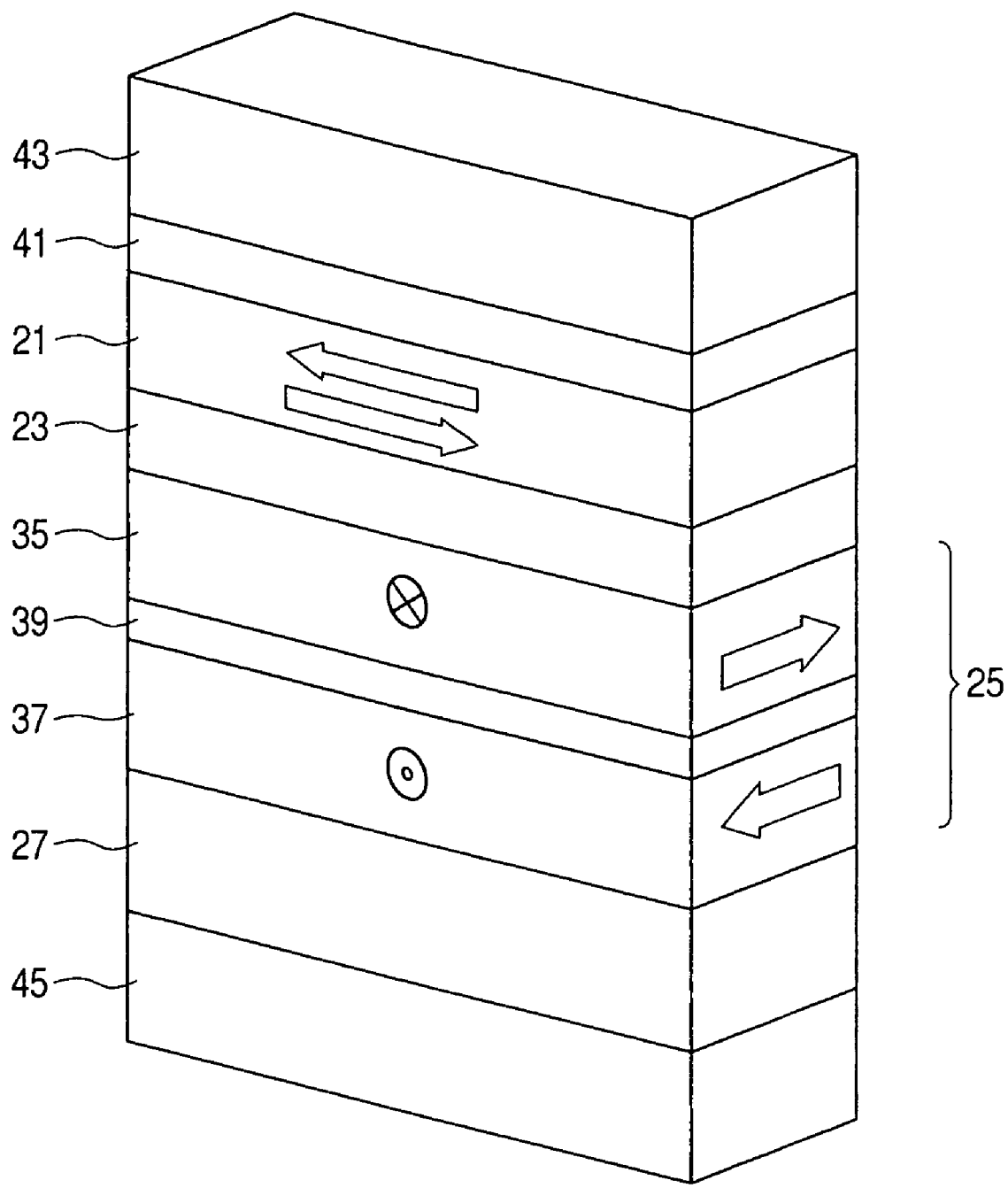
FIG. 4 illustrates a related art synthetic spin valve having a shielding structure.
Figure 8A:
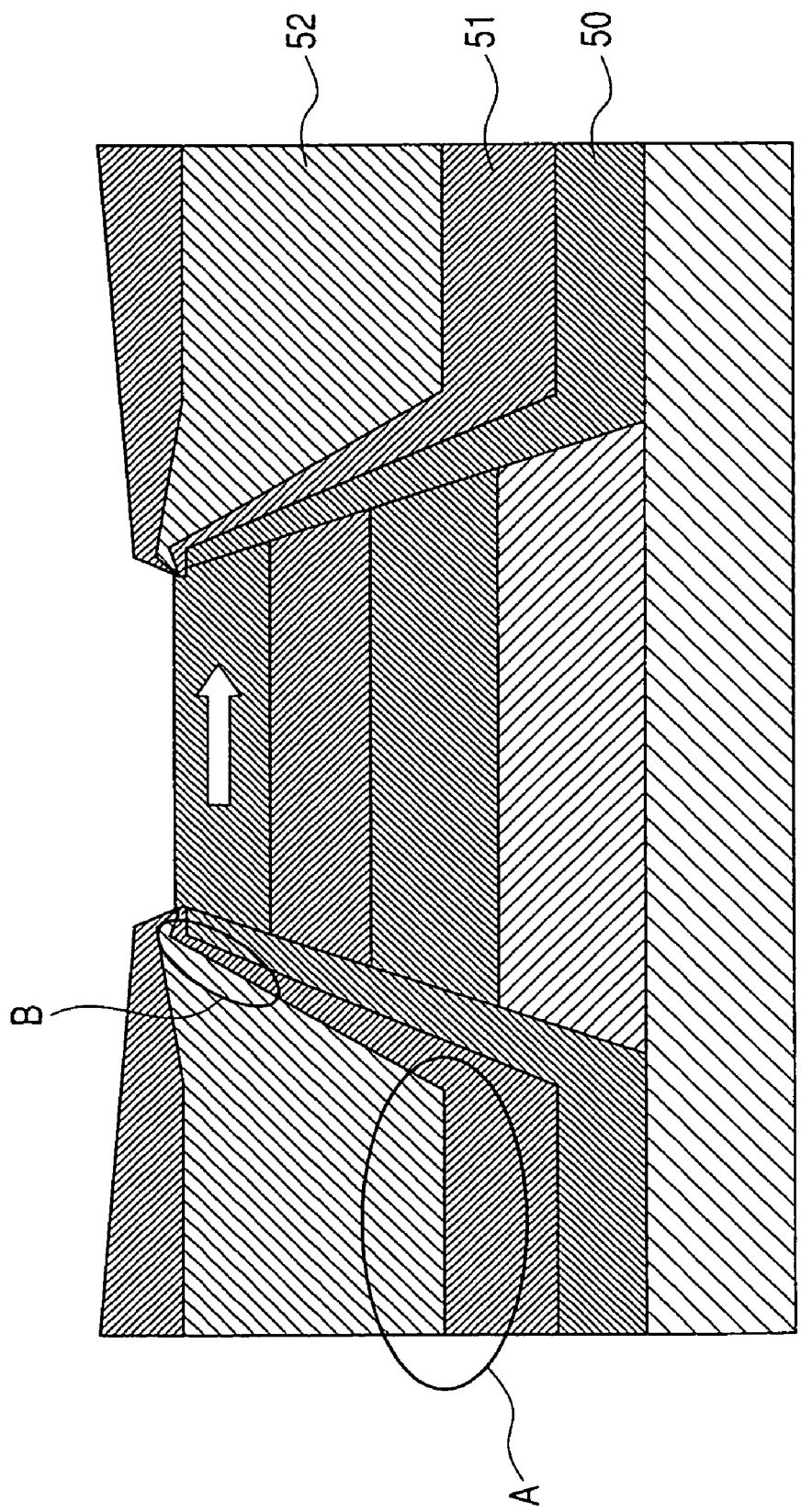

Also, it is an advantage of the present invention that the stabilizer can be made very thin. There is no need for any buffer layer above the insulator 108, in distinction with the related art hard bias stabilizer illustrated in FIG. 8(a). In the related art, the buffer layer is about 10 nm and usually requires two or three films. In contrast, the thickness of the stabilizer according to the current invention is about 400 nm or more. Thus, the overall thickness of the stabilizer can be reduced, and the process can be simplified. Further, shield to shield thickness of the sensor device can also be decreased in accordance with current and/or future needs.

The CoFe material has a high pinning on the order of 1 kOe with IrMn or PtMn AFM layer, which provides high stability against the media field. Further, the high magnetic moment of CoFe has a positive effect on free layer stability. As a result, current leakage and noise problems experienced in the related art are substantially reduced and/or eliminated.

The present invention is not limited to the specific above-described embodiments. It is contemplated that numerous modifications may be made to the present invention without departing from the spirit and scope of the invention as defined in the following claims.

INDUSTRIAL APPLICABILITY

The present invention has various industrial applications. For example, it may be used in data storage devices having a magnetic recording medium, such as hard disk drives of computing devices, multimedia systems, portable communication devices, and the related peripherals. However, the present invention is not limited to these uses, and any other use as may be contemplated by one skilled in the art may also be used.

The invention claimed is:

1. A device having a spin valve, comprising:
   a magnetic sensor including,
   a free layer having an adjustable magnetization direction in response to a magnetic field,
   a pinned layer having a fixed magnetization stabilized in accordance with a first antiferromagnetic (AFM) layer positioned on a surface of the pinned layer opposite a spacer sandwiched between the pinned layer and the free layer,
   a buffer sandwiched between the first AFM layer and a bottom shield that shields undesired flux at a lower surface of the magnetic sensor, and
   a capping layer sandwiched between the free layer and a top shield that shields undesired flux at an upper surface of the magnetic sensor; and
   a stabilizer positioned adjacent to the magnetic sensor and separated from the magnetic sensor by an insulator layer, the stabilizer comprising a pinned ferromagnetic stabilizer positioned on the insulator layer adjacent to the free layer and pinned by a second AFM layer sandwiched between the pinned ferromagnetic stabilizer and an upper insulator upon which the shield is positioned.

2. The device of claim 1, wherein the spin valve is a top type and the pinned layer is one of (a) single-layered and (b) multi-layered with a pinned layer spacer between sublayers thereof.

3. The device of claim 1, wherein the spacer is one of:
   (a) an insulator spacer for use in a tunnel magnetoresistive (TMR) spin valve;
   (b) a conductor for use in a giant magnetoresistive (GMR) spin valve; and
   (c) an insulator matrix having a magnetic nanocontact between the pinned layer and the free layer for use in a ballistic magnetoresistive (BMR) spin valve.

4. The device of claim 3, wherein the insulator spacer comprises at least one of AlN, $Al_2O_3$ and MgO.

5. The device of claim 3, wherein the magnetic nanocontact has a diameter of less than about 30 nm.

6. The device of claim 1, wherein the pinned layer has one of a single layer structure and a synthetic structure and a total thickness between about 2 nm and about 10 nm.

7. The device of claim 1, wherein the free layer comprises at least one of Co, Fe, and Ni, and at least one of the pinned layer and the free layer includes at least one of $Fe_3O_4$, $CrO_2$, NiFeSb, NiMnSb, PtMnSb, MnSb, $La_{0.7}Sr_{0.3}MnO_3$, $Sr_2FeMoO_6$, $SrTiO_3$, CoFeO, NiFeN, NiFeO, NiFe and CoFeN.

8. The device of claim 1, further comprising leads in the magnetic sensor for conducting a sense current of the magnetic sensor, and a sense current flows in a film thickness direction.

9. The device of claim 1, wherein the free layer has a thickness between about 1 nm and 3 nm and a width of about 100 nm or less, and wherein the pinned ferromagnetic stabilizer has a thickness that is substantially the same as a thickness of the free layer within a 20% margin.

10. The device of claim 1, the insulator layer comprising:
    a first sublayer that covers the bottom shield and sides of the magnetic sensor from the bottom shield to a first portion of the spacer; and
    a second sublayer that covers the first sublayer, a second portion of the spacer not covered by the first sublayer, the free layer and the capping layer.

11. The device of claim 10, wherein the second portion of the spacer has a thickness between about 1 nm and 5 nm, and the upper insulator has a thickness that prevents current flow between the magnetic sensor and the stabilizer.

12. The device of claim 1, wherein the pinned ferromagnetic stabilizer comprises $Fe_xCo_{1-x}$, wherein the x is between about 40 and 60.

13. The device of claim 1, wherein the second AFM layer comprises at least one of IrMn, PtMn and PtPdMn.

14. A method of fabricating a magnetic sensor, comprising the steps of:
    forming a free layer having an adjustable magnetization direction in response to an external field, a pinned layer having a fixed magnetization direction by exchange coupling with a first antiferromagnetic (AFM) layer positioned on a surface of the pinned layer opposite a spacer sandwiched between the pinned layer and the free layer, a buffer sandwiched between the AFM layer and a bottom shield that shields undesired flux at a first outer surface of the magnetic sensor, and a capping layer on the free layer;
    forming a mask on a first region on the capping layer;
    performing a first ion milling step to generate a sensor region and depositing a first insulator sublayer thereon;
    positioning a second mask to cover a second region smaller than the first region on the capping layer;
    performing a second ion milling step to generate a shape of the magnetic sensor by removing parts of the capping layer, the free layer and a first portion of the spacer that are outside of the second region;
    depositing a stabilizer having a second insulator sublayer, a pinned ferromagnetic stabilizer layer, a second AFM layer and an upper insulator, and then removing the second mask; and
    forming a top shield on the capping layer and the upper insulator.

15. The method of claim 14, wherein the spacer is formed as one of:
    (a) an insulator for use in a tunnel magnetoresistive (TMR) spin valve;
    (b) a conductor for use in a giant magnetoresistive (GMR) spin valve; and
    (c) an insulator matrix having a magnetic nanocontact with a diameter of less than about 30 nm formed between the pinned layer and the free layer for use in a ballistic magnetoresistive (BMR) spin valve.

16. The method of claim 15, wherein the insulator spacer comprises at least one of AlN, $Al_2O_3$ and MgO and the magnetic nanocontact has a diameter of less than about 30 nm.

17. The method of claim 14, wherein the pinned layer has one of a single layer structure and a synthetic structure, and a total thickness between about 2 nm and about 10 nm,
    the free layer is made of at least one of Co, Fe, and Ni and has a thickness of less than about 5 nm, and
    at least one of the pinned layer and the free layer is made of at least one of $Fe_3O_4$, $CrO_2$, NiFeSb, NiMnSb, PtMnSb, MnSb, $La_{0.7}Sr_{0.3}MnO_3$, $Sr_2FeMoO_6$, $SrTiO_3$, CoFeO, NiFeN, NiFeO, NiFe and CoFeN.

18. The method of claim 14, further comprising leads in the magnetic sensor for conducting a sense current of the magnetic sensor, and a sense current of the magnetic sensor flows perpendicular to a plane of the magnetic sensor.

19. The method of claim 14, wherein the free layer has a thickness between about 1 nm and 3 nm and a width of less than 100 nm, and wherein the pinned ferromagnetic stabilizer has a thickness that is substantially the same as a thickness of the free layer with a 20% margin.

20. The method of claim 14, wherein the first portion of the spacer has a thickness that is between about 1 nm and 5 nm and is substantially similar to a thickness of the second sublayer, and the upper insulator has a thickness that prevents current flow between the magnetic sensor and the stabilizer.

21. The method of claim 14, wherein the pinned ferromagnetic stabilizer comprises $Fe_xCo_{1-x}$, wherein the x is between about 40 and 60.

22. The method of claim 14, wherein the second AFM layer comprises at least one of IrMn, PtMn and PtPdMn.

* * * * *